United States Patent

[11] 3,588,887

[72] Inventor Arney Landy, Jr.
Saint Paul, Minn.

[21] Appl. No. 822,244
[22] Filed May 6, 1969
[45] Patented June 28, 1971
[73] Assignee the United States of America as represented by the Secretary of the Navy

[54] OPTICAL ANALOG-TO-DIGITAL CONVERTER HAVING DUAL ENCODER DISCS
6 Claims, 5 Drawing Figs.

[52] U.S. Cl. 340/347P
[51] Int. Cl. G08c 9/06, G08c 9/00
[50] Field of Search 340/347

[56] References Cited

UNITED STATES PATENTS

| | | | |
|---|---|---|---|
| 2,747,797 | 5/1956 | Beaumont | 340/347X |
| 3,020,533 | 2/1962 | Schaefer et al. | 340/347 |
| 3,156,911 | 11/1964 | Ziserman | 340/347 |
| 3,205,491 | 9/1965 | Brown et al | 340/347 |
| 3,230,523 | 1/1966 | Farrand | 340/347 |
| 3,247,505 | 4/1966 | Coyle | 340/347 |
| 3,247,506 | 4/1966 | Grim | 340/347 |
| 3,419,727 | 12/1968 | Pabst | 340/347X |
| 3,504,359 | 3/1970 | Hawksworth | 340/347 |

*Primary Examiner*—Maynard R. Wilbur
*Assistant Examiner*—Michael K. Wolensky
*Attorneys*—Edgar J. Brower and H. H. Losche

ABSTRACT: An optical analog-to-digital converter having an analog shaft input driving two encoder discs at a ratio of 64 to 1 with a photocell mask of lead and lag rows of windows between each encoder disc and light sensitive photocells positioned such that the photocells sense the position of the encoder windows in both lag and lead positions by switching the lead and lag photocell circuits in accordance with switching from the least significant bit to produce binary "1" and "0" output signals for each optical track of the two encoder discs to correlate the shaft input rotated position.

INVENTOR
ARNEY LANDY, JR.

BY H. H. Losche

ATTORNEY

OPTICAL ANALOG-TO-DIGITAL CONVERTER HAVING DUAL ENCODER DISCS

BACKGROUND OF THE INVENTION

This invention relates to analog-to-digital shaft encoder converters and more particularly to converters having dual encoder discs driven at a predetermined ratio with lead and lag masked window openings between the encoder discs and light sensitive photocells to convert the shaft position into digital readout from the photocells free of ambiguity normally caused by readout from window edges.

Prior art analog-to-digital shaft encoders have been devised in which only one encoder disc is used in conjunction with lead and lag windowed masks in light paths to lead and lag switched photocells, as disclosed in the U.S. Pat. Ser. No. 2,747,797, to Beaumont, which issued May 29, 1956. Other very popular types of analog-to-digital shaft encoders are those which use electric brushes to sense the windowed openings of encoder discs. This type is very positive in sensing the openings for readout but such brush contacts are subject to the contaminating elements, such as dirt and oxidation, to reduce the effectiveness or destroy the proper operation of the brushes. These devices, while very useful, have the disadvantages of ambiguity in digital readout and erratic circuit continuity through brush contacts.

SUMMARY OF THE INVENTION

In this invention the input shaft providing the analog of a shaft position to be determined drives two encoder discs at a turns ratio of 64:1. The invention is described and shown with seven optical tracks on the encoder disc of the lower significant bits and six optical tracks on the encoder disc of the higher significant bits. Each encoder disc is masked to provide for lead and lag windows and with light sensitive silicon solar cells in the light path. The photocell for the least significant bit controls a Schmitt trigger circuit to switch the next optical track lead and lag photocells at the proper sequence to eliminate the ambiguities of readout usually caused at the leading and trailing edges of the windows in the encoder discs. The outermost optical track on the seven-track encoder disc has 64 windows equally spaced therearound for the least significant bit readout. The next adjacent track has 32 equally spaced windows, the third adjacent track has 16 equally spaced windows, and so on to the seventh track which has only one window opening one-half way around the encoder disc. The second encoder disc is identical to the first encoder disc, except the first track of 64 windows are missing, to provide a 13 optical track converter. These encoder discs are geared together in a compact manner and a single light source between two lens systems provides the light through the two encoder discs. The three tracks of the lowest significant bits employ V-scan while the remainder of the tracks employ U-scan to provide a highly reliable optical digital shaft encoder in a very compact package wherein the spacing between the dual encoder discs provides higher resolution readout. It is therefore a general object of this invention to provide an analog-to-digital optical shaft encoder converter of compact size and high resolution readout with a minimum of ambiguity in digital results to provide a digital readout of shaft rotative position.

BRIEF DESCRIPTION OF THE DRAWINGS

These and other objects and the attendant advantages, features and uses will become more apparent as the description proceeds when considered along with the accompanying drawings, in which.

DESCRIPTION OF THE PREFERRED EMBODIMENT

Figure 1:
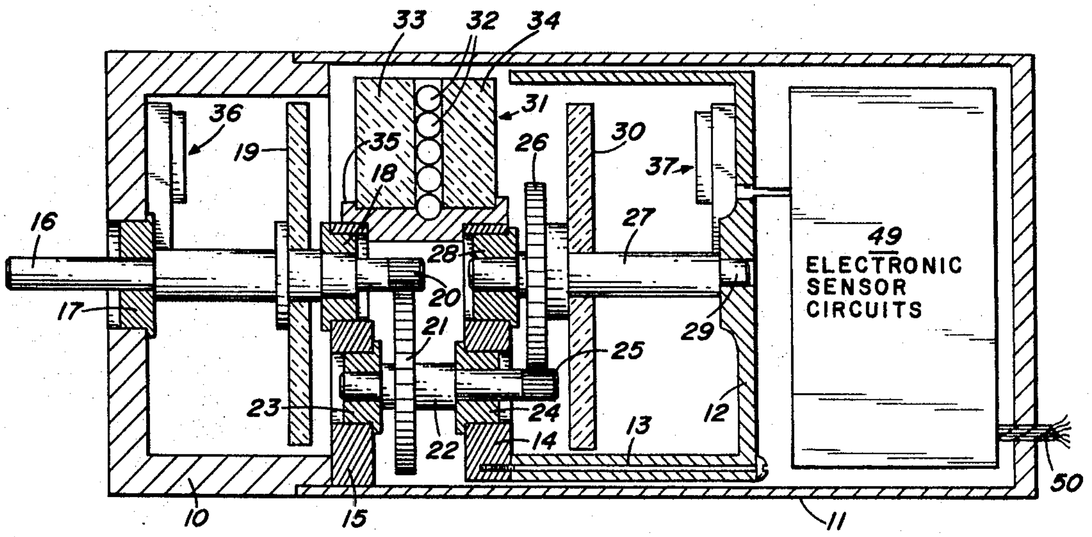
FIG. 1 is a cross-sectional view of the optical analog-to-digital converter showing the internal structure thereof.
Figure 2:
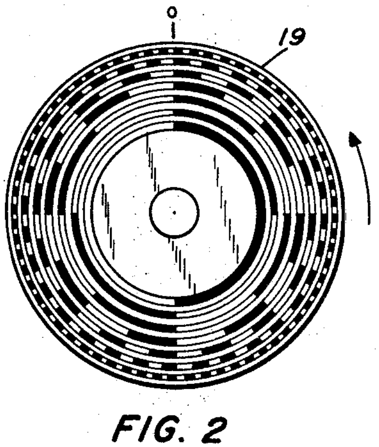
FIG. 2 is a face plan view of one of the encoder discs used in the device of FIG. 1.
Figure 3:
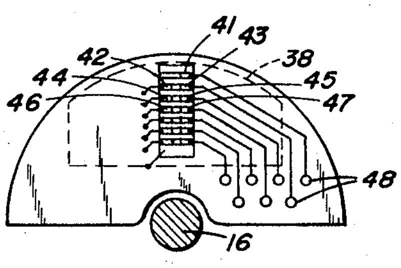
FIG. 3 is an elevational view of the photocell assembly.
Figure 4:
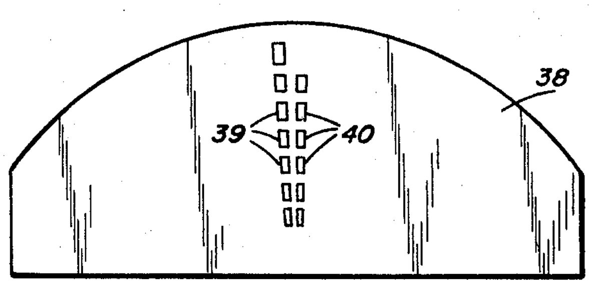
FIG. 4 is an elevational view greatly enlarged as shown in FIG. 3 illustrating the mask for the photocell assembly.

Referring more particularly to FIG. 1, with occasional reference to FIGS. 2, 3, and 4, there is illustrated in sectional view a case consisting of two primary parts 10 and 11 with an internal case divisional wall 12. The divisional wall 12 is secured, as by screws or other suitable means 13, to one of two upstanding supports 14 and 15 within one compartment, as shown in FIG. 1. A first shaft 16 is journaled through the outer end wall in the case member 10 by a bearing support 17, the inner end of the shaft 16 being supported in a bearing 18 in the top of the support 15. The shaft 16 has various flanges and shoulders thereon to support it against end wise movement in the bearings 17 and 18 and has fixed thereon a first encoder wheel or disc 19 adjacent the support 15. The encoder wheel 19 has opaque and transparent portions therein for the seven optical tracks, as shown in FIG. 2. These optical track transparent portions consist of one in the track of the most significant bit (MSB), the next optical track consists of two, the next consists of four, and so on through the optical tracks to the seventh optical track which consists of 64 transparent windows for the least significant bit (LSB). The inner end of shaft 16 has gear teeth cut thereon, as shown at 20, in mesh with a gear wheel 21 on an idler shaft 22 journaled by the bearings 23 and 24 in the supports 14 and 15. The opposite end of the idler shaft 22 has gear teeth cut thereon at 25 in mesh with a gear wheel 26 on a second shaft 27 journaled on one end in a bearing 28 in the upper end of the support 14 and in the division wall 12 by the journal 29. The second shaft 27 has a second encoder disc 30 affixed thereon which encoder wheel may be identical to the encoder wheel 19 or may be an encoder wheel identical to the encoder wheel 19 except that the track for the LSB of 64 optical windows may be eliminated. The gear reduction means 20, 21, 25, 26 will provide a gear ratio of 64:1 such that the encoder disc 19 will rotate 64 times to one revolution of the encoder disc 30.

Supported on the two supports 14 and 15 is a light source assembly 31 having a plurality of lights 32 centrally located between a pair of lens systems 33 and 34 directed to transmit light through the encoder discs 19 and 30. The light source lamps, and lenses are supported on a base member 35 structurally supported on the two support members 14 and 15 within the compartment housing the gear reduction means and the encoder discs 19 and 30.

On the end wall within this compartment is a photocell assembly 36, more particularly shown in FIG. 3. A similar photocell assembly 37 is also shown affixed in this compartment to the inner wall 12. Seven photocell assemblies are mounted in a vertical position as shown in FIG. 3 and a mask 38, as shown in FIG. 4, is affixed between the photocell assembly and the encoding wheels so that the photocells are responsive to light through the mask openings 39 and 40. The outermost photocell 41 is a single photocell which is responsive to light through the single outermost mask window 39, as seen in FIG. 4, responsive to light through the 64 windowed optical track of disc 19 (not used for disc 30). The remaining six photocell assemblies consist of two photocells 42—43, 44—45, 46—47, etc., for each optical track through the photocell assembly. Each photocell assembly is connected to terminal points 48 for connection to the sensor circuits housed in the electronic sensor block 49, shown in FIG. 1 and shown in circuit detail in FIG. 5. The output of the electronic sensor circuits 49 is by a cable of conductor means 50 to any counter or digital display circuit, as desired.

Figure 5:
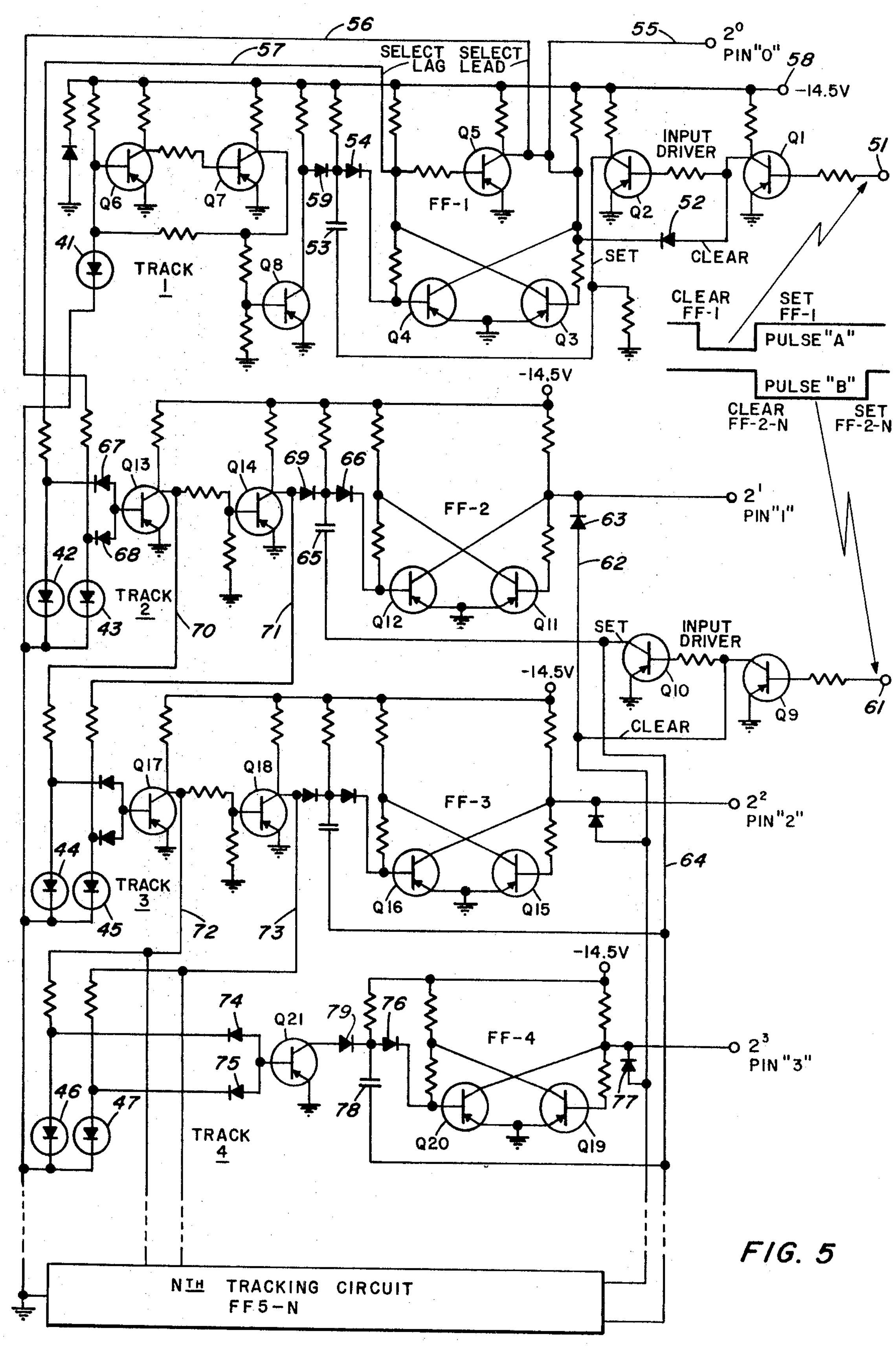
FIG. 5 is a circuit schematic diagram of the photocell and sensor circuit for the several optical tracks of the converter.

Referring more particularly to FIG. 5 the single photocell 41 is operative in optical track 1, the photocells 42 and 43 are operative in track 2, photocells 44 and 45 are operative in track 3, photocells 46 and 47 are operative in the optical track 4, and so on throughout all the optical tracks 5 through 13, as illustrated from the encoder disc shown in FIG. 2. The sensor circuit for optical track 1 has an input on terminal 51 of a sampling or interrogation pulse "A" which is resistance coupled to the base of a transistor Q1 of an input driver circuit consisting of transistors Q1 and Q2. The collector of transistor Q1 is resistance coupled to the base of transistor Q2, the output of transistor Q1 being through a diode coupling 52, and the collector output of transistor Q2 being through a coupling capacitor 53. The diode 52 is coupled to one side of a circuit which may be a Schmitt trigger circuit or similar trigger circuit consisting of transistors Q3, Q4, and Q5. The collector output pulse of transistor Q1 through the diode 52 will hereinafter be referred to as the "clearing pulse" and its conductor is resistance coupled to the base of transistor Q3 while the collector output pulse of transistor Q2 is coupled by a conductor through the capacitor 53 and a diode 54 to the base of transistor Q4. The output pulse from the collector of transistor Q2 will be hereinafter referred to as the "set" of "setting pulse" for the Schmitt trigger generally referred to as FF–1. The transistor Q5 has its base resistance coupled to the collector of transistor Q3 and its collector coupled in common to the collector of transistor Q4 for the purpose of speeding up the switching operation of the Schmitt trigger FF–1. The collector of transistor Q4 has an output 55 constituting the pin "0" output or the digital output $2^0$. The pin "0" output is the LSB of the digital output. The collector of transistor Q4 is also the select lead output 56 for subsequent digital sensor circuits while the collector output at transistor Q3 on the conductor 57 is the select lag output for the next higher significant bit. The input driver circuit and Schmitt trigger circuit just described are in a voltage supply circuit such as the supply of −14.5 volts applied to terminal 58 and a fixed potential such as ground. Whenever pulse A is applied to terminal 51, a positive clearing pulse will be conducted through the diode 52 to place transistor Q3 in a nonconductive state or "off" state and the transistor Q4 in the conductive or "on" state. This is produced by the leading edge of pulse A, this leading edge being ineffective through the diode 54 upon transistor Q4. Upon the trailing negative going edge of pulse A being applied through transistors Q1 and Q2, the trailing edge or setting pulse will be applied through the coupling capacitor 53 and diode 54 to turn transistor Q4 "off" and transistor Q3 "on." Accordingly, the leading edge of the positive pulse produced by transistor Q1 and the trailing edge of the negative pulse produced by transistor Q2 provide the clearing and setting pulses for clearing and setting the Schmitt trigger FF–1.

The photocell 41 is also in the voltage circuit from terminal 58 to ground and is coupled to the base of a transistor Q6, the collector of which is resistance coupled to the base of transistor Q7. The collector of transistor Q7 is resistance coupled to the base of a transistor Q8, the collector of which is coupled through a diode 59 to the terminal point of the capacitor 53 and diode 54. Transistors Q6, Q7, and Q8 operate as inverter amplifiers coupling the photocell 41 to the Schmitt trigger circuit FF–1. Whenever the photocell 41 is covered against the impingement of light the Schmitt trigger FF–1 will be tripped cutting off transistor Q4 and turning on transistor Q3, as will be more particularly described in the statement of operation of the whole circuit.

A sample or interrogation pulse "B" is applied to terminal 61 which is resistance coupled to the base of a transistor Q9 and its collector is resistance coupled to the base of a transistor Q10. Transistors Q9 and Q10 constitute an input driver circuit to produce "clearing" pulses on the collector output of transistor Q9 and "setting" pulse on the collector output of transistor Q10 similar to the input driver circuit for the optical track 1. The clearing pulse is applied over a conductor means 62 through a diode 63 to the base of transistor Q11 while the setting pulse on the collector of transistor Q10 is applied on a common conductor 64 through a coupling capacitor 65 and a diode 66 to the base of transistor Q12 in a bistable multivibrator or flip-flop circuit FF–2. The two photocells 42 and 43 in the optical track 2 are coupled in series in the select lag conductor 57 and the select lead conductor 56 respectively. The select lag conductor 57 is coupled through a diode 67 while the select lead conductor 56 is coupled through a diode 68 to the base of a transistor Q13. The collector of transistor Q13 is resistance coupled to the base of a transistor Q14 and the collector of transistor Q14 is coupled through a diode 69 to the terminal of the coupling capacitor 65 and diode 66. Whichever photocell 42 or 43 is selected by applying the negative supply voltage thereto will produce a high resistance to this supply voltage or low resistance to this supply voltage in accordance as to whether it is impinged by light from the light source 32 through the encoder wheel transparent and opaque tracks to selectively apply the negative supply voltage or 0 voltage to the base of transistor Q13. For example, if the supply voltage is applied over the select lead conductor 56 and the photocell 43 is uncovered to receive the impingement of light from the source 32, Q13 will be cut off and Q14 will be turned "on" or made conductive to produce a positive pulse through the diodes 69 and 66 to the base of transistor Q12 cutting this transistor off to produce a negative binary voltage on the output pin "1" being the digital output $2^1$ as will be more fully described in the statement of operation. The sensor circuit in optical track 3 is identical to the sensor circuit of optical track 2 and accordingly will not be described in detail herein, it being sufficient to advise that the output on pin "2" will provide the digital output $2^2$ for optical track 3. The lag signal is supplied from Q13 over conductor 70 while the lead signal is supplied from Q14 over conductor 71 to the photocells 44 and 45.

Referring more particularly to the optical track 4, the photocells 46 and 47 for the lag and lead positions of the optical track are coupled to the inverter outputs of inverters Q17 and Q18 in optical track 3 over conductors 72 and 73 in like manner that the output of inverters in optical track 2 are coupled to the photocells 44 and 45 in optical track 3. The lag conductor 72 is coupled through a diode 74 while the lead conductor 73 is coupled through a diode 75 to the base of transistor Q21, the collector output of which is coupled through diodes 76 and 79 to the base of transistor Q20 in the flip-flop circuit FF–4. The flip-flop circuit FF–4 consists of transistors Q20 and Q19 coupled in a circuit from a −14.5 volt supply and ground as all sensor circuits. The "B" clearing pulse from the input driver transistor Q9 is applied through a coupling diode 77 to the base of transistor Q19 while the "B" setting pulse on conductor 64 is applied through the coupling capacitor 78 and the diode 76 to the base of transistor Q20. The "B" clearing pulse on the conductor means 62 is applied to all the sensing circuits of the optical tracks 2 through N through coupling diodes such as 63 and 77 herein, while the "B" setting pulse on the conductor means 64 is applied to all of the FF circuits of the sensor circuits in the optical tracks 2 through N through a coupling capacitor similar to 53 and 78 of these four optical tracks shown. The FF circuits operate as memory circuits for the digital readout during the time interval of pulses A and B. For the particular encoding disc shown in FIG. 2 having seven tracks, six of these tracks being used in a similar or identical coding disc 30 will provide 13 optical tracking circuits in which the Nth tracking circuit in FIG. 5 would be the 13th tracking circuit. It is to be understood however that if an additional optical track is placed on the encoder disc as shown in FIG. 2 providing eight optical tracks, the shaft encoder converter of this invention could be readily adapted and used for fifteen optical tracks.

It is pointed out that the first optical track provides the lead and lag selection for the next higher LSB and this track is the only one for the first encoder converter which reads the outermost optical track on the encoder discs shown in FIG. 2. The next two optical tracks 2 and 3 for inverter transistors Q13 and Q14, and Q17 and Q18 produce the lead and lag selection for this next higher optical track, the lead and lag output from inverter transistors Q17 and Q18 being coupled in common to all succeeding sensor circuits from tracks 4 through 7. The optical track 8 which is the LSB track for the encoder disc 30 will have a sensor circuit similar to the sensor circuit of optical track 3, shown herein, and the remaining sensor circuits for optical tracks 9 through 13 will be identical to the sensor circuit of optical track 4. By this circuitry the first three optical tracks 1,2, and 3 will be operating the V-scan mode while all the remaining optical tracks 4 through 13 will be operating in the U-scan mode. In general the V-scan utilizes the outermost optical track as shown in FIG. 2, being the optical track with 64 transparent windows therein, to select the lead and lag for the next higher LSB optical track to follow the logic that, when the lag selector bit is "on" the lagging photocell of the next higher order digit will be energized but when the lag selector bit is "off" the leading photocell of the next significant bit will be energized. In like manner for the U-scan the rules of logic are that when the selected photocell of the controlling optical track reads a "1" the lagging photocell of the next higher order digit will be energized and if the photocell reads a "0" the lagging photocell of the next higher order digit will be energized and if the photocell reads a 0 the leading photocell in the next higher order digit will be energized. The theory and use of U-scan and V-scan is more particularly shown and described in the periodical Electromechanical Design, Components and Systems, for Jan. 1967, the article entitled "Shaft Encoders" by Edward S. Charkey, beginning on page 51.

OPERATION

In the operation of the device let it be assumed that, as shown in FIG. 1, the shaft 16 is coupled to some device for determining rotative position. The output leads 50 may be coupled to a counter circuit or other display devices for providing a digital readout of the position of shaft 16. The device of FIG. 1 will be described in operation herein as though seven optical tracks are used as shown in FIG. 2 with the companion photocell readout and masking means as used and shown in FIGS. 3 and 4.

In the operation of the device reference is made to TABLE 1 herein for the purpose of following the described operation.

TABLE I

| Track | | PC | Lag voltage | Lead voltage | Output voltage | Digit |
|---|---|---|---|---|---|---|
| | Clear pulse "A". | | | 0 | 0 | |
| 1 | | Covered | 0 | | | $2^0$ |
| | | Uncovered | | 0 | 0 | |
| | Set pulse "A". | | 0 | | | |
| | Clear pulse "B". | | | | 0 | |
| 2 | | Covered | 0 | | 0 | $2^1$ |
| | | Uncovered | | 0 | | |
| | Set pulse "B". | | | | | |
| | Clear pulse "B". | | | | 0 | |
| 3 | | Covered | 0 | | 0 | |
| | | Uncovered | | 0 | | $2^2$ |
| | Set pulse "B". | | | | | |
| | Clear pulse "B". | | | | 0 | |
| 4 | | Covered | 0 | | | |
| | | Uncovered | | 0 | 0 | $2^3$ |
| | Set pulse "B". | | | | | |

Let it be assumed that shaft 16 has been rotated to some position for readout and readout is now desirable. Pulses A and B will be applied to the circuit for sampling or interrogation to provide readout on pins "0," "1," "2," "3," et cetera, of the sensor circuits. When pulse A is applied as shown in TABLE 1 for optical track 1, the clearing pulse of leading edge of pulse A will turn Q3 "off" and Q4 "on" to provide a negative (−) voltage on the output of the select lag conductor 57 and "0" voltage on the lead selector conductor 56 as well as output 55 to pin "0." If the photocell 41 is covered, as by an opaque portion of the outermost optical track shown in FIG. 2, the resistance through photocell 41 is high and a high negative voltage will be applied to the base of Q6 turning this transistor "on," cutting transistor Q7 "off," and turning transistor Q8 "on" to produce a positive pulse through the diodes 59 and 54 to the base of Q4 turning it "off" thereby producing a "0" lag voltage on conductor 57, negative supply voltage on conductor 56 and output conductor 55 to pin "0." On the other hand if the photocell 41 is uncovered as having impingement of light through the transparent section of the outermost optical track of encoder disc 19 shown in FIG. 2, the resistance of photocell 41 will be low cutting "off" transistor Q6, turning "on" Q7, cutting "off" Q8, producing a high negative voltage at the anode of diode 59 which is blocked from the base of transistor Q4 leaving the Schmitt trigger unchanged thereby producing negative voltage on lag conductor 57, "0" voltage on lead conductor 56, and "0" voltage on 55 to pin 2.

Now referring to the optical track 2, when pulse B is applied to terminals 61 the input driver will produce a positive pulse on the base of transistor Q11 cutting this transistor "off" and transistor Q12 "on" clearing the FF–2 circuit for the output signals from the optical tracking photocells 42 and 43. If the photocell 41 in optical track 1 is uncovered providing a negative supply voltage over the lag conductor 57 as hereinabove described, the photocell 42 will be activated by virtue of a supply voltage on the anode thereof. Accordingly, photocell 42 will be looking at the next lowest significant bit track in FIG. 2 to determine whether an opaque or a transparent section appears over the lag opening 39 of the mask 38. If photocell 42 is covered the resistance of this photocell will be high producing a high negative voltage on the base of transistor Q13 turning this transistor "on" and turning transistor Q14 "off" allowing the collector voltage to go to the negative supply voltage which is blocked from passing through the diodes 69 and 66 to the base of transistor Q2 and, accordingly, FF–2 circuit will remain unchanged. The lag voltage on conductor 70 will be 0 while the lead voltage on conductor 71 will be substantially the negative supply voltage. On the other hand, if the photocell 42 is uncovered, the lag voltage on conductor 70 will be substantially the negative supply voltage and the voltage on the lead conductor 71 will be 0 and the output voltage on pin 1 will be substantially the negative supply voltage producing the $2^1$ of the digital output or the "1" state. It may be seen that the sensor circuit in the optical track 2 will operate in the same manner as if the lead voltage had been applied to the photocell 43 instead of the lag voltage photocell 42 since the operation of either the lag or lead photocell will affect the sensor circuit in the same manner.

Since the optical track of FIG. 3 is constructed the same as that of FIG. 2, a specific description thereto will not be given herein. It is to be understood that, as shown in TABLE 1, whenever the selected photocell 44 or 45 is energized but is covered by an opaque portion of the encoder disc in FIG. 2, the pin 2 output for the digit $2^2$ will remain unchanged. On the other hand, if the selected photocell 44 or 45 is uncovered, the pin "2" output will be a negative voltage or "1" state. It may also be seen in TABLE 1 when the photocell is covered the lag selected voltage will be 0 and the lead voltage selected will be negative and in the uncovered photocell condition the lag voltage will be negative and the lead voltage will be 0.

Referring now in particular to the optical track 4, during the time interval of pulse B, if the selected photocell 46 or 47 for lag or lead detection is covered, the output of pin "3" will be "0" whereas if the selected photocell 46 or 47 is uncovered the output on pin "3" will be a negative voltage or a digital bit "1."For the covered condition of either 46 or 47 the supply voltage will be applied to the base of transistor Q21 turning this transistor "on" producing a positive pulse through the diode 76 on the base of transistor 20 cutting this transistor "off" and turning transistor Q19 "on" to produce a 0 voltage on output pin "3." For the uncovered condition of one of the photocells 46 or 47 the opposite will be true on the output of pin "3." The lead and lag outputs from the optical track 3 is coupled in parallel to the sensor circuits of optical tracks 4 through 7, and accordingly, all these tracks will operate the same as described for track 4 herein. The sensor circuit of optical track 8 is identical to that of optical track 3 and will select the lead and lag voltages in the same manner as the sensor circuit in optical track 3 which lag and lead voltage will be applied to the sensor circuits of optical tracks 9 through 13 for operation the same as described herein for optical track 4. It is to be understood that the first 7 optical tracks are produced by the encoder disc 19 while optical tracks 8 through 13 are produced by the encoder disc 30. In this manner ambiguities of any crossover from opaque to transparent portions in the optical tracks will be eliminated by the selection of the lag and lead photocells to provide an accurate digital readout of the shaft position for the shaft 16 throughout 64 shafts turns providing 8,192 shaft division readouts of shaft 16 position. The digital readouts from pin "0" through pin 13 will provide the digital numbers of the $2^0$ through $2^{12}$ for digital indications.

As hereinbefore stated, the number of optical paths can be increased by increasing the number of optical tracks on the encoder discs.

While many modifications and changes may be made in the constructional details and features of this invention to provide more or less numbers of optical tracks as hereinbefore described, I desire to be limited in the spirit of my invention only by the scope of the appended claims.

I claim:

1. An optical analog-to-digital shaft encoder comprising:

a case enclosed first shaft having an exterior extension and having a first encoder disc thereon and geared through reduction gearing to a second shaft having a second encoder disc thereon, each encoder disc having a plurality of windowed annular optical tracks therein representative of digital bits from the least significant bit to the most significant bit, said first encoder disc having one more least significant bit optical track than said second encoder disc providing a single least significant bit optical track;

a light source and lens system between said first and second encoder discs to project light through the windows of said encoder discs;

a mask on the opposite side of each encoder disc from the light source, each mask having a row of lead window openings and a row of lag window openings in alignment with the plurality of windowed optical tracks, one mask having a single window opening in alignment with the single least significant bit optical track of said first encoder disc;

a light sensitive element behind each lead and lag window opening and said single window opening of said mask, there being one each lead and lag light sensitive element and window opening for each optical track on each of said encoder discs and a single light sensitive element for the single window opening, each light sensitive element producing a binary signal output upon being impinged by light from said source;

a sensor circuit coupling the output of said single light sensitive element and of each pair of lead and lag light sensitive elements and having a memory network therein to memorize the binary signal output of said light sensitive elements, the light sensitive element and sensor circuits for the single and next two least significant bit optical tracks being electrically coupled and arranged to provide V-scan and for the remaining higher bit optical tracks being electrically coupled and arranged to provide U-scan; and an interrogation input pulses source coupled to said sensor circuits for setting said memory networks for digital readout and for clearing said sensor circuits for new inputs whereby the rotative position of said external shaft extension is represented in the digital readout of said memory networks in all sensor circuits.

2. An optical analog-to-digital shaft encoder as set forth in claim 1 wherein:

said sensor circuit for said single least significant bit optical track coupled to said single light sensitive element and the memory network therefor is a Schmitt trigger circuit, the output of the latter producing alternate supply voltage selectively for said light sensitive elements in said lead and lag optical tracks, and said sensor circuits of the next two higher order least significant bit optical tracks include inverters and the memory network thereof is a bistable multivibrator with the digital readout taken from one side of the multivibrator, said inverter outputs providing the voltage supply to the lead and lag light sensitive elements of the next higher order optical tracks providing said U-scan.

3. An optical analog-to-digital shaft encoder as set forth in claim 2 wherein said sensor circuits for the fourth and higher optical tracks have the inverter outputs from the third from the least significant bit optical track supplying the voltage selectively to the lead and lag light sensitive elements of the fourth and higher optical tracks in parallel providing said U-scan.

4. An optical analog-to-digital shaft encoder as set forth in claim 3 wherein said encoder discs each have a single window in the optical track for the most significant bit overlying one-half of the annular track, two windows equally spaced over two half portions of the next lower significant bit optical track, four windows equally spaced about four quarter sections of the next lower significant bit optical track, eight windows equally spaced about eight sections of the next lower significant bit optical track, and so on through said optical tracks to the least significant bit.

5. An optical analog-to-digital shaft encoder as set forth in claim 4 wherein said case includes two compartments, one compartment having a pair of upstanding supports providing bearing supports for said first and second shafts, for said reduction gearing, and for said light source and lens system, and the other compartment housing said sensor circuits therein.

6. An optical analog-to-digital shaft encoder as set forth in claim 5 wherein said interrogation input pulse source comprise a first pulse applied to said sensor circuit for said least significant bit and a second pulse applied to the remaining sensor circuits.